United States Patent
Bressanelli et al.

(10) Patent No.: US 10,110,360 B2
(45) Date of Patent: Oct. 23, 2018

(54) RECOVERY MECHANISM FOR ROHC WITH LOST INITIALIZATION AND REFRESH MESSAGES

(71) Applicant: QUALCOMM Incorporated, San Diego, CA (US)

(72) Inventors: Dominique Francois Bressanelli, Eschborn Hessen (DE); Saket Bathwal, Hyderabad (IN); Deepak Sah, Hyderabad (IN)

(73) Assignee: QUALCOMM Incorporated, San Diego, CA (US)

( * ) Notice: Subject to any disclaimer, the term of this patent is extended or adjusted under 35 U.S.C. 154(b) by 98 days.

(21) Appl. No.: 15/216,480

(22) Filed: Jul. 21, 2016

(65) Prior Publication Data

US 2017/0033911 A1 Feb. 2, 2017

Related U.S. Application Data

(60) Provisional application No. 62/197,245, filed on Jul. 27, 2015.

(51) Int. Cl.
*H04L 5/00* (2006.01)
*H04L 1/16* (2006.01)
(Continued)

(52) U.S. Cl.
CPC ........ *H04L 5/0055* (2013.01); *H03M 7/3079* (2013.01); *H04L 1/1685* (2013.01);
(Continued)

(58) Field of Classification Search
None
See application file for complete search history.

(56) References Cited

U.S. PATENT DOCUMENTS 7,290,063 B2 10/2007 Kalliokulju et al.
8,488,583 B2 7/2013 Pelletier
(Continued)

FOREIGN PATENT DOCUMENTS

WO WO-0228107 A2 4/2002

OTHER PUBLICATIONS

Pelletier et al. "RFC 6846-RObust Header Compression (ROHC) a Profile for TCP/IP (ROHC-TCP)", Jan. 2013, Internet Enginerring Task Force (IERF), 1-96 pages.*
(Continued)

*Primary Examiner* — Saba Tsegaye
(74) *Attorney, Agent, or Firm* — Norton Rose Fulbright LLP

(57) ABSTRACT

A recovery mechanism for robust header compression (ROHC) is disclosed for wireless communication systems. The ROHC recovery mechanism may allow a receiver and/or transmitter in the wireless systems to establish or reestablish a context of a packet transmission session when an initialization and refresh message is lost. In the ROHC recovery mechanism, upon receiving a compressed packet that is not associated with a context, a receiver sends a message to a transmitter suggesting the transmitter to transition to another mode. Upon receiving a subsequent packet transmission that is not associated with a context, the receiver sends another message indicating that a context has not been established or has been lost. The transmitter may then send the receiver necessary information to establish a context for the packet transmission session.

16 Claims, 4 Drawing Sheets

(51) Int. Cl.
  *H04L 1/18* (2006.01)
  *H04L 29/06* (2006.01)
  *H03M 13/00* (2006.01)
  *H03M 7/30* (2006.01)
  *H04W 28/06* (2009.01)

(52) U.S. Cl.
  CPC ............ *H04L 1/1854* (2013.01); *H04L 69/04* (2013.01); *H04W 28/06* (2013.01); *H03M 7/6047* (2013.01); *H03M 13/6306* (2013.01); *H03M 13/6312* (2013.01); *H04L 69/22* (2013.01)

(56) References Cited

U.S. PATENT DOCUMENTS

| | | | | |
|---|---|---|---|---|
| 2005/0090273 | A1* | 4/2005 | Jin | H04L 12/1877 455/502 |
| 2006/0187846 | A1 | 8/2006 | Pelletier et al. | |
| 2011/0149790 | A1* | 6/2011 | Mabuchi | H04L 1/0034 370/252 |
| 2012/0189023 | A1* | 7/2012 | Huang | H04L 1/0006 370/477 |
| 2015/0280905 | A1* | 10/2015 | Shah | H04L 7/048 370/504 |
| 2016/0088460 | A1 | 3/2016 | Kim et al. | |

OTHER PUBLICATIONS

Barvaux D., "c_uncompressed.c", in \rohc-1.7.0.tar\rohc-1.7.0\rohc-1.7.0\src\comp of rohc-1.7.0.tar.xz, Jun. 21, 2014 (Jun. 21, 2014), pp. 1-24, XP055306757, Retrieved from the Internet: URL: http://rohc-lib.org/download/rohc-1.7.x/1.7.0.tar.xz [retrieved on Sep. 29, 2016].

Barvaux D., e al., "rohc—about the feedback packet; Question #241545", Jan. 3 2014 (Jan. 3, 2014), pp. 1-3, XP055306378, Retrieved from the Internet: URL: https://answers.launchpad.net/rohc/+question/241545 [retrieved on Sep. 28, 2016].

Barvaux D., "rohc_decomp.c", in \rohc-1.7.0.tar\rohc-1.7.0\rohc-1.7.0\src\decomp of rohc-1.7.0.tar.xz, Jun. 21, 2014 (Jun. 21, 2014), pp. 1-113, XP055306620, Retrieved from the Internet: URL: https://rohc-lib.org/download/rohc-1.7.x/1.7.0/rohc-1.7.0. tar.xz [retrieved on Sep. 29, 2016].

Bormann C., et al., "RObust Header Compression (ROHC): Framework and Four Profiles: RTP, UDP, ESP, and Uncompressed; rfc3095.txt", 5. JCT-VC Meeting; 96. MPEG Meeting; Mar. 16, 2011-Mar. 23, 2011; Geneva; (Joint Collaborative Team on Video Coding of ISO/IEC JTC1/SC29/WG11 and ITU-T SG.16); URL: http://WFTP3.ITU.INT/AV-ARCH/JCTVC-SITE/, Internet Engineering Task Force, IETF, Ch, Jul. 1, 2001 (Jul. 1, 2001), pp. 1-168, XP015008878, ISSN: 0000-0003.

International Search Report and Written Opinion—PCT/US2016/043509—ISA/EPO—dated Oct. 11, 2016.

Mandin J., "Support for Robust Header Compression in 802.16 Convergence Sublayer; C80216e-05_287", IEEE Draft; C80216E-05_287, IEEE-SA, Piscataway, NJ, USA, vol. 802.16e, Jun. 8, 2005 (Jun. 8, 2005), pp. 1-3, XP017627084, [retrieved on Nov. 10, 2005].

Pelletier G., et al., "RObust Header Compression Version 2 (ROHCv2): Profiles for RTP, UDP, IP, ESP and UDP-Lite; rfc5225.txt", 5. JCT-VC Meeting; 96. MPEG Meeting; Mar. 16, 2011-Mar. 23, 2011; Geneva; (Joint Collaborative Team on Video Coding of ISO/IECJTC1/SC29/WG11 and ITU-TSG.16); URL: http://wftp3.itu.int/av-arch/jctvc-site/, Internet Engineering Task Force, IETF, CH, Apr. 1, 2008 (Apr. 1, 2008), XP015057212, pp. 1-124, ISSN: 0000-0003.

* cited by examiner

RECOVERY MECHANISM FOR ROHC WITH LOST INITIALIZATION AND REFRESH MESSAGES

CROSS-REFERENCE TO RELATED APPLICATIONS

This application claims the benefit of U.S. Provisional Patent Application No. 62/197,245, entitled. Recovery Mechanism for ROHC with Lost Initialization and Refresh Messages," filed on Jul. 27, 2015, which is expressly incorporated by reference herein in its entirety.

BACKGROUND

Field

Aspects of the present disclosure relate generally to wireless communication systems, and more particularly, to a recovery mechanism for robust header compression (ROHC) when the initialization and refresh message is lost.

Background

Wireless communication networks are widely deployed to provide various communication services such as voice, video, packet data, messaging, broadcast, and the like. These wireless networks may be multiple-access networks capable of supporting multiple users by sharing die available network resources. Such networks, which are usually multiple access networks, support communications for multiple users by sharing the available network resources. One example of such a network is the Universal Terrestrial Radio Access Network (UTRAN). The UTRAN is the radio access network (RAN) defined as a part of the Universal Mobile telecommunications System (UMTS), a third generation (3G) mobile phone technology supported by the 3rd Generation Partnership Project (3GPP). Examples of multiple-access network formats include Code Division Multiple Access (CDMA) networks. Time Division Multiple Access (TDMA) networks. Frequency Division Multiple Access (FDMA) networks, Orthogonal FDMA (OFDMA) networks, and Single-Carrier FDMA (SC-FDMA) networks.

A wireless communication network may include a number of base stations or node Bs that can support communication for a number of user equipments (UEs). A UE may communicate with a base station vie downlink and uplink. The downlink (or forward link) refers to the open communication link from the base station to the UE, and the uplink (or reverse link) refers to the communication link from the UE to the base station.

A base station may transmit data and control information on the downlink to a UE and/or may receive data and control information on the uplink from the UE. On the downlink, a transmission from the base station may encounter interference due to transmissions from neighbor base stations or from other wireless radio frequency (RF) transmitters. On the uplink, a transmission from the UE may encounter interference from uplink transmissions of other UEs communicating with the neighbor base stations or from other wireless RF transmitters. This interference may degrade performance on both the downlink and uplink.

As the demand for mobile broadband access continues to increase, the possibilities of interference and congested networks grow with more UEs accessing the long-range wireless communication networks and more short-range wireless systems being deployed in communities. Research and development continue to advance the UMTS technologies not only to meet the growing demand for mobile broadband access, but to advance and enhance the user experience with mobile communications.

SUMMARY

In one aspect of the disclosure, a recovery mechanism for ROHC is presented for a wireless communication system. The wireless communication system may comprise at least a transmitter configured to transmit a message with a compressed header and a receiver configured to receive and decompress a message with a compressed header. During a packet transmission session between a transmitter/compressor and a receiver/decompressor, a context may be established for the packet transmission session at the transmitter and/or receiver. A context of a packet transmission session, which may be associated with a identifier at a transmitter and/or receiver, may assist the transmitter and/or receiver to identify the particular packet transmission. A context may be established at a receiver when it receives message, such as an initialization and refresh (IR) message, from a transmitter that includes all necessary information to establish a context. The ROHC recover mechanism may enable a receiver and/or transmitter to establish or re-establish a context of a packet transmission session when an IR message is lost or damaged. An IR message may be lost or damaged due to radio interface impairment al the transmitter and/or receiver or on the wireless communication channel.

In an additional aspect of the disclosure, a method of wireless communication includes receiving a compressed pocket transmission from a transmitter, determining a context associated with the compressed packet transmission, sending a coded negative acknowledgement message that is protected with a cyclic redundancy check (CRC) from a receiver to the transmitter in response to determining the compressed packet transmission is associated with an unknown context, receiving a subsequent packet transmission from the transmitter, and sending a static negative acknowledgement message to the transmitter in response to the subsequent compressed packet transmission failing to include information to generate the context in order to request the transmitter to send the information to generate the context.

In an additional aspect of the disclosure, an apparatus configured for wireless communication is disclosed. The apparatus includes at least one processor, and a memory coupled to the processor. The processor is configured to receive a compressed packet transmission from a transmitter, to determine a context associated with the compressed packet transmission, to send a coded negative acknowledgement message that is protected with a cyclic redundancy check (CRC) from a receiver to the transmitter in response to determining the compressed packet transmission is associated with an unknown context, to receive a subsequent packet transmission from the transmitter, and to send a static negative acknowledgement message to the transmitter in response to the subsequent compressed packet transmission failing to include information to generate the context in order to request the transmitter to send the information to generate the context.

In an additional aspect of the disclosure, a non-transitory computer-readable medium having program code recorded thereon. The program code further includes code to receive a compressed packet transmission from a transmitter, to determine a context associated with the compressed packet transmission, to send a coded negative acknowledgement message that is protected with a cyclic redundancy check (CRC) from a receiver to the transmitter in response to determining the compressed packet transmission is associated with as unknown context, receive a subsequent packet transmission from the transmitter, and send a static negative acknowledgement message to the transmitter in response to the subsequent compressed packet transmission failing to include information to generate the context in order to request the transmitter to send the information to generate the context.

In an additional aspect of the disclosure, an apparatus configured for wireless communication includes means for receiving a compressed packer transmission from a transmitter, means for determining a context associated with the compressed packet transmission, means for sending a coded negative acknowledgement message that is protected with a cyclic redundancy check (CRC) from a receiver to the transmitter in response to determining the compressed packet transmission is associated with an unknown context, means for receiving a subsequent packet transmission from the transmitter, and means for sending a static negative acknowledgement message to the transmitter in response to the subsequent compressed packet transmission failing to include information to generate the context in order to request the transmitter to send the information to generate the context.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description, and not as a definition of the limits of the claims.

DETAILED DESCRIPTION

The detailed description set form below, in connection with the appended drawings, is intended as a description of various configurations and is not intended to limit the scope of the disclosure. Rather, the detailed description includes specific details for the purpose of providing a thorough understanding of the inventive subject matter. It will be apparent to those skilled in the an that these specific details are not required in every case and that, in home instances, well known structures and components are shown in block diagram form for clarity of presentation.

The techniques described herein may be used for various wireless communication networks such as CDMA, TDMA, FDMA, OFDMA, SC-FDMA and other networks. The terms "network" and "system" are often used interchangeably. A CDMA network may implement a radio technology, such as Universal Terrestrial Radio Access (UTRA), Telecommunications Industry Association's (TIA's) CDMA2000®, and the like. The UTRA technology includes Wideband CDMA (WCDMA) and other variants of CDMA. The CDMA2000® technology includes the IS-2000, IS-95 and IS-856 standards from the Electronics Industry Alliance (ETA) and TIA. A TDMA network may implement a radio technology, such as Global System for Mobile Communications (GSM). An OFDMA network may implement a radio technology, such as Evolved UTRA (E-UTRA), Ultra Mobile Broadband (UMB), IEEE 802.11 (Wi-Fi), IEEE 802.16 (WiMAX), IEEE 802.20, Flash-OFDMA, and the like. The UTRA and E-UTRA technologies are part of Universal Mobile Telecommunication System (UMTS). 3GPP Long Term Evolution (LTE) and LTE-Advanced (LTE-A) are newer releases of the UMTS that use E-UTRA. UTRA, E-UTRA. UMTS, LTE, LTE-A and GSM are described in documents from an organization called the "3rd Generation Partnership Project" (3GPP). CDMA2000® and UMB are described in documents from an organization called the "3rd Generation Partnership Project 2" (3GPP2). The techniques described herein may be used for the wireless networks and radio access technologies mentioned above, as well as other wireless networks and radio access technologies. For clarity, certain aspects of the techniques are described below for LTE or LTE-A (together referred to in the alternative as "LTE/-A") and use such LTE/-A terminology in much of the description below.

Figure 1:
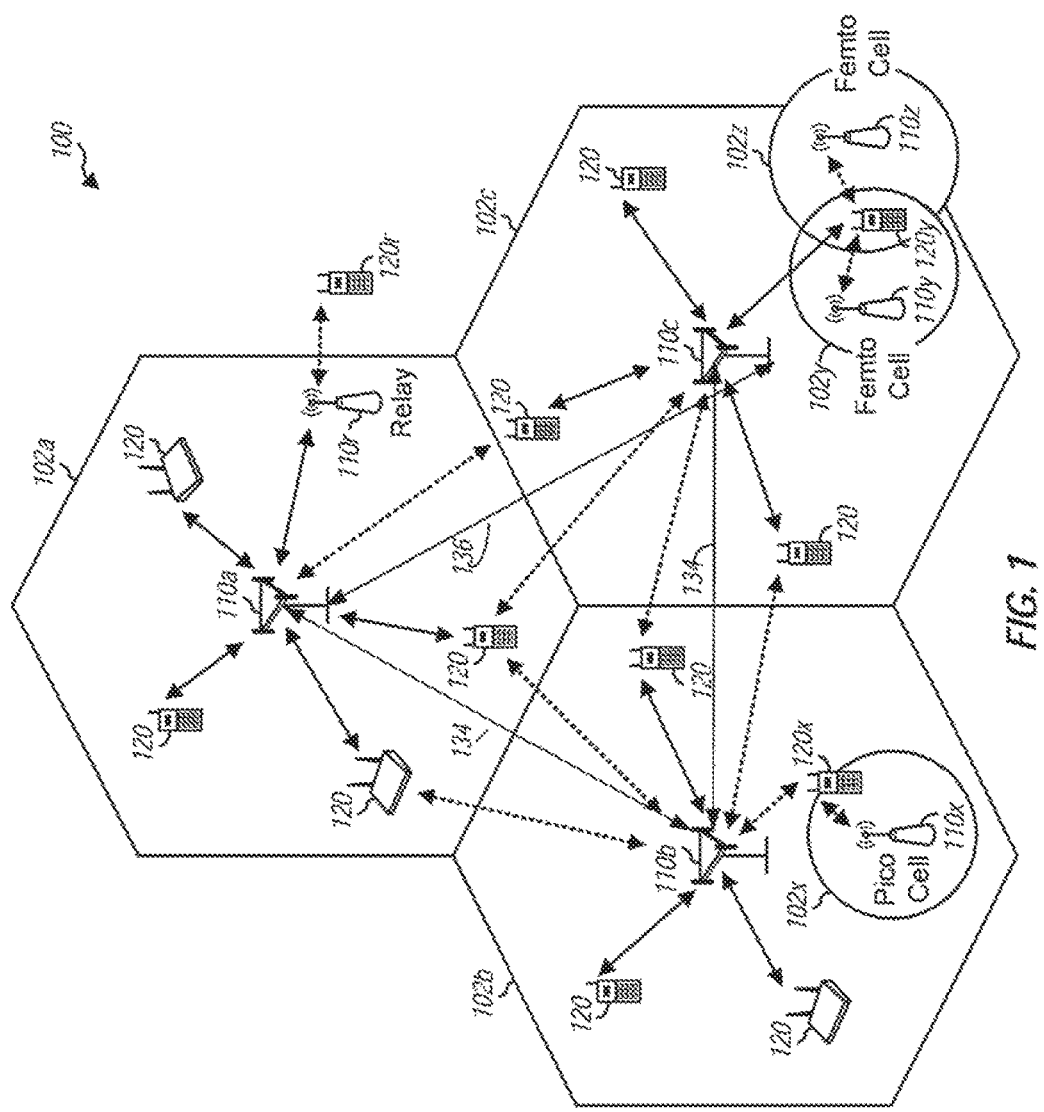
FIG. 1 is a block diagram conceptually illustrating an example of a mobile communication system.

FIG. 1 shows a wireless network 100 for communication, which may be an LTE-A network. The wireless network 100 includes a number of evolved node Bs (eNBs) 110 and other network entities. An eNB may be a station that communicates with the UEs and may also be referred to as a base station, a node B, an access point, and the like. Each eNB 110 may provide communication coverage for a particular geographic area. In 3GPP, the term "cell" can refer to this particular geographic coverage area of an eNB and/or an eNB subsystem serving the coverage area, depending on the context in which the term is used.

An eNB may provide communication coverage for a macro cell, a pico cell, a femto cell, and/or other types of cell. A macro cell generally covers a relatively large geographic area (e.g., several kilometers in radius) and may allow unrestricted access by UEs with service subscriptions with the network provider. A pico cell would generally cover a relatively smaller geographic area and may allow unrestricted access by UEs with service subscriptions with the network provider. A femto cell would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). An eNB for a macro cell may be referred to as a macro eNB. An eNB for a pico cell may be referred to as a pico eNB. And, an eNB for a femto cell may be referred to as a femto eNB or a home eNB. In the example shown in FIG. 1, the eNBs 110a, 110b and 110c are macro eNBs for the macro cells 102a, 102b and 102c, respectively. The eNB 110x is a pico eNB for a pico cell 102x. And, the eNBs 110y and 110z are femto eNBs for the femto cells 102y and 102z, respectively. An eNB may support one or multiple (e.g., two, three, four, and the like) cells.

The wireless network 100 also includes relay stations. A relay station is a station that receives a transmission of data and/or other information from an upstream station (e.g., an eNB, a UE, or the like) and sends a transmission of the data and/or other information to a downstream station (e.g., another UE, another eNB, or the like). A relay station may also be a UE that relays transmissions for other UEs. In the example shown in FIG. 1, a relay station 110r may communicate with the eNB 110a and a UE 120r, in which the relay station 110r acts as a relay between the two network elements (the eNB 110a and the UE 120r) in order to facilitate communication between them. A relay station may also be referred to as a relay eNB, a relay, and the like.

The wireless network 100 may support synchronous or asynchronous operation. For synchronous operation, the eNBs may have similar frame timing, and transmissions from different eNBs may be approximately aligned in time. For asynchronous operation, the eNBs may have different frame liming, and transmissions from different eNBs may not be aligned in time.

The UEs 120 are dispersed throughout the wireless network 100, and each UE may be stationary or mobile. A UE may also be referred to us a terminal, a mobile station, a subscriber unit, a station, or the like. A UE may be a cellular phone, a personal digital assistant (PDA), a wireless modem, a wireless communication device, a handheld device, a tablet computer, a laptop computer, a cordless phone, a wireless local loop (WLL) station, or the like. A UE may be able to communicate with macro eNBs, pico eNBs, femto eNBs, relays, and the like. In FIG. 1, a solid line with double arrows indicates desired transmissions between a UE and a serving eNB, which is an eNB designated to serve the UE on the downlink and/or uplink. A dashed line with double arrows indicates interfering transmissions between u UE and an eNB.

LTE/-A utilizes orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, or the like. Each subcarrier may be modulated with data. In general, modulation symbols are sent in the frequency domain with OFDM and m the time domain with SC-FDM. The spacing between adjacent subcarriers may be fixed, and the total number of subcarriers (K) may be dependent on the system bandwidth. For example, K may be equal to 128, 256, 512, 1024 or 2048 for a corresponding system bandwidth of 1.25, 2.5, 5, 10 or 20 megahertz (MHz), respectively. The system bandwidth may also be partitioned into sub-bands. For example, a sub-band may cover 1.08 MHz, and there may be 1, 2, 4, 8 or 16 sub-bands for a corresponding system bandwidth of 1.25, 2.5, 5, 10 or 20 MHz, respectively.

Figure 2:
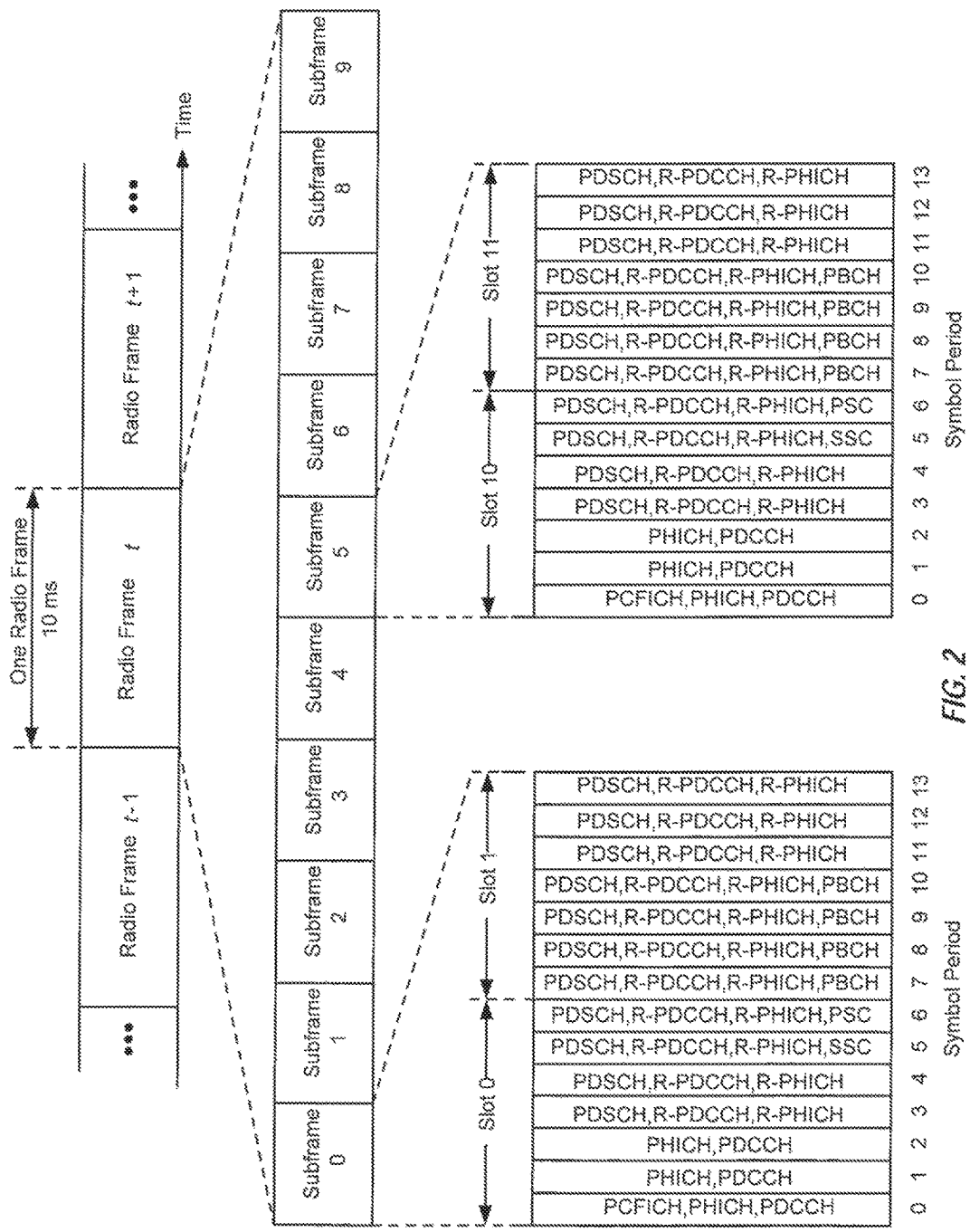
FIG. 2 is a block diagram conceptually illustrating an example of a downlink frame structure in a mobile communication system.

FIG. 2 shows a downlink frame structure used in LTE/-A. The transmission timeline for the downlink may be partitioned into units of radio frames. Each radio frame may have a predetermined duration (e.g., 10 milliseconds (ms)) and may be partitioned into 10 subframes with indices of 0 through 9. Each subframe may include two slots. Each radio frame may thus include 20 slots with indices of 0 through 19. Each slot may include L symbol periods, e.g., 7 symbol periods for a normal cyclic prefix (as shown in FIG. 2) or 6 symbol periods for on extended cyclic prefix. The 2L symbol periods in each subframe may be assigned indices of 0 through 2L−1. The available time frequency resources may be partitioned into resource blocks. Each resource block may cover N subcarriers (e.g., 12 subcarriers) in one slot.

In LTE/-A, an eNB may send a primary synchronization signal (PSS) and a secondary synchronization signal (SSS) for each cell in the eNB. The primary and secondary synchronization signals may be sent in symbol periods 6 and 5, respectively, in each of subframes 0 and 5 of each radio frame with the normal cyclic prefix, as shown in FIG. 2. The synchronization signals may be used by UEs for cell detection and acquisition. The eNB may send a Physical Broadcast Channel (PBCH) in symbol periods 0 to 3 in slot 1 of subframe 0. The PBCH may carry certain system information.

The eNB may send a Physical Control Format Indicator Channel (PCFICH) in the first symbol period of each subframe as seen in FIG. 2. The PCFICH may convey the number of symbol periods (M) used for control channels, where M may be equal to 1, 2 or 3 and may change from subframe to subframe. M may also be equal to 4 for a small system bandwidth, e.g., with less than 10 resource blocks. In the example shown in FIG. 2, M=3. The eNB may send a Physical HARQ Indicator (Channel (PHICH) and a Physical Downlink Control Channel (PDCCH) in the first M symbol periods of each subframe. The PDCCH and PHICH are also included in the first three symbol periods in the example shown in FIG. 2. The PHICH may carry information to support hybrid automatic retransmission (HARQ). The PDCCH may carry information on resource allocation for UEs and control information for downlink channels. The eNB may send a Physical Downlink Shared Channel (PDSCH) in the remaining symbol periods of each subframe. The PDSCH may carry data for UEs scheduled for data transmission on the downlink.

In addition to sending PHICH and PDCCH in the control section of each subframe, i.e., the first symbol period of each subframe, the LTE-A may also transmit these control-oriented channels in the data portions of each subframe as well. As shown in FIG. 2, these new control designs utilizing the data region, e.g., the Relay-Physical Downlink Control Channel (R-PDCCH) and Relay-Physical HARQ Indicator Channel (R-PHICH) are included in the later symbol periods of each subframe. The R-PDCCH is a new type of control channel utilizing the data region originally developed in the context of half-duplex relay operation. Different from legacy PDCCH and PHICH, which occupy the first several control symbols in one subframe, R-PDCCH and R-PHICH are mapped to resource elements (REs) originally designated as the data region. The new control channel may be in the form of Frequency Division Multiplexing (FDM), Time Division Multiplexing (TDM), or a combination of FDM and TDM.

The eNB may send the PSS, SSS and PBCH in the center 1.08 MHz of the system bandwidth used by the eNB. The eNB may send the PCFICH and PHICH across the entire system bandwidth in each symbol period in which these channels are sent. The eNB may send the PDCCH to groups of UEs in certain portions of the system bandwidth. The eNB may send the PDSCH to specific UEs in specific portions of the system bandwidth. The eNB may send the PSS, SSS, PBCH, PCFICH and PHICH in a broadcast manner to all UEs, may send the PDCCH in a unicast manner to specific UEs, and may also send the PDSCH in a unicast manner to specific UEs.

A number of resource elements may be available in each symbol period. Each resource element may cover one subcarrier in one symbol period and may be used to send one modulation symbol, which may be a real or complex value. Resource elements not used for a reference signal in each symbol period may be arranged into resource element groups (REGs). Each REG may include four resource elements in one symbol period. The PCFICH may occupy four REGs, which may be spaced approximately equally across frequency, in symbol period 0. The PHICH may occupy three REGs, which may be spread across frequency, in one or more configurable symbol periods. For example, the three REGs for the PHICH may all belong in symbol period 0 or may be spread in symbol periods 0, 1 and 2. The PDCCH may occupy 9, 18, 32 or 64 REGs, which may be selected from the available REGs, in the first M symbol periods. Only certain combinations of REGs may be allowed for the PDCCH.

A UE may know the specific REGs used for the PHICH and the PCFICH. The UE may search different combinations of REGs for the PDCCH. The number of combinations to search is typically less than the number of allowed combinations for the PDCCH. An eNB may send the PDCCH to the UE in any of the combinations that the UE will search.

A UE may be within the coverage of multiple eNBs. One of these eNBs may be selected to serve the UE. The serving eNB may be selected based on various criteria such as received power, path loss, signal-to-noise ratio (SNR), etc.

Referring back to FIG. 1, the wireless network 100 uses the diverse set of eNBs 110 (i.e., macro eNBs, pico eNBs, femto eNBs, and relays) to improve the spectral efficiency of the system per unit area. Because the wireless network 100 uses such different eNBs for its spectral coverage, it may also be referred to as a heterogeneous network. The macro eNBs 110a-c are usually carefully planned and placed by the provider of the wireless network 100. The macro eNBs 110a-c generally transmit at high power levels (e.g., 5 W-40 W). The pico eNB 110x and the relay station 110r, which generally transmit at substantially lower power levels (e.g., 100 mW-2 W), may be deployed in a relatively unplanned manner to eliminate coverage holes in the coverage area provided by the macro eNBs 110a-c and improve capacity in the hot spots. The femto eNBs 110y-z, which are typically deployed independently from the wireless network 100 may, nonetheless, be incorporated into the coverage area of the wireless network 100 either as a potential access point to the wireless network 100, if authorized by their administrator(s), or at least as an active and aware eNB that may communicate with the other eNBs 110 of the wireless network 100 to perform resource coordination and coordination of interference management. The femto eNBs 110y-z typically also transmit at substantially lower power levels (e.g., 100 mW-2 W) than the macro eNBs 110a-c.

In operation of a heterogeneous network, such as the wireless network 100, each UE is usually served by the eNB 110 with the better signal quality, while the unwanted signals received from the other eNBs 110 are treated as interference. While such operational principals can lead to significantly sub-optimal performance gains in network performance are realized in the wireless network 100 by using intelligent resource coordination among the eNBs 110, better server selection strategies, and more advanced techniques for efficient interference management.

A pico eNB, such as the pico eNB 110x, is characterized by a substantially lower transmit power when compared with a macro eNB, such as the macro eNBs 110a-c. A pico eNB will also usually be placed around a network, such as the wireless network 100, in an ad hoc manner. Because of this unplanned deployment, wireless networks with pico eNB placements, such as the wireless network 100, can be expected to have large areas with low signal to interference conditions, which can make for a more challenging RF environment for control channel transmissions to UEs on the edge of a coverage area or cell (a "cell-edge" UE). Moreover, the potentially large disparity (e.g., approximately 20 dB) between the transmit power levels of the macro eNBs 110a-c and the pico eNB 110x implies that, in a mixed deployment, the downlink coverage area of the pico eNB 110x will be much smaller than that of the macro eNBs 110a-c.

In the uplink case, however, the signal strength of the uplink signal is governed by the UE, and, thus, will be similar when received by any type of the eNBs 110. With the uplink coverage areas for the eNBs 110 being roughly the same or similar, uplink handoff boundaries will be determined based on channel gains. This can lead to a mismatch between downlink handover boundaries and uplink handover boundaries. Without additional network accommodations, the mismatch would make the server selection or the association of UE to eNB more difficult m the wireless network 100 than in a macro eNB-only homogeneous network, where the downlink and uplink handover boundaries are more closely matched.

If server selection is based predominantly on downlink received signal strength, the usefulness of mixed eNB deployment of heterogeneous networks, such as the wireless network 100, will be greatly diminished. This is because the larger coverage area of the higher powered macro eNBs, such as the macro eNBs 110a-c, limits the benefits of splitting the cell coverage with the pico eNBs, such as the pico eNB 110x, because, the higher downlink received signal strength of the macro eNBs 110a-c will attract all of the available UEs, while the pico eNB 110x may not be serving any UE because of its much weaker downlink transmission power. Moreover, the macro eNBs 110a-c will likely not have sufficient resources to efficiently serve those UEs. Therefore, the wireless network 100 will attempt in actively balance the load between the macro eNBs 110a-c and the pico eNB 110x by expanding the coverage area of the pico eNB 110x. This concept is referred to as cell range extension (CRE).

The wireless network 100 achieves CRE by changing the manner in which server selection is determined. Instead of basing server selection on downlink received signal strength, selection is based more on the quality of the downlink signal. In one such quality-based determination, server selection may be based on determining the eNB that offers the minimum path loss to the UE. Additionally, the wireless network 100 provides a fixed partitioning of resources between the macro eNBs 110a-c and the pico 110x. However, even with this active balancing of load, downlink interference from the macro eNBs 110a-c should be mitigated for the UEs served by the pico eNBs, such as the pico eNB 110x. This can be accomplished by various methods, including interference cancellation at the UE, resource coordination among the eNBs 110, or the like.

In a heterogeneous network with cell range extension, such as the wireless network 100, in order for UEs to obtain service from the lower-powered eNBs, such as the pico eNB 110x, in the presence of the stronger downlink signals transmitted from the higher-powered eNBs, such as the macro eNBs 110a-c, the pico eNB 110x engages in control channel and data channel interference coordination with the dominant interfering ones of the macro eNBs 110a-c. Many different techniques for interference coordination may be employed to manage interference. For example, inter-cell interference coordination (ICIC) may be used to reduce interference from cells in co-channel deployment. One ICIC mechanism is adaptive resource partitioning. Adaptive resource partitioning assigns subframes to certain eNBs. In subframes assigned to a first eNB, neighbor eNBs do not transmit. Thus, interference experienced by a UE served by the first eNB is reduced. Subframe assignment may be performed on both the uplink and downlink channels.

For example, subframes may be allocated between three classes of subframes: protected subframes (U subframes), protected subframes (N subframes), and common subframes (C subframes). Protected subframes are assigned to a first eNB for use exclusively by the first eNB. Protected subframes may also be referred to as "clean" subframes based on the lack of interference from neighboring eNBs. Prohibited subframes are subframes assigned to a neighbor eNB, and the first eNB is prohibited from transmitting data during the prohibited subframes. For example, a prohibited subframe of the first eNB may correspond to a protected subframe of a second interfering eNB. Thus, the first eNB is the only eNB transmitting data during the first eNBs protected subframe. Common subframes may be used for data transmission by multiple eNBs. Common subframes may also be referred to as "unclean" subframes because of the possibility of interference from other eNBs.

At least one protected subframe is statically assigned per period. In some cases only one protected subframe is statically assigned. For example, if a period is 8 milliseconds, one protected subframe may be statically assigned to an eNB during every 8 milliseconds. Other subframes may be dynamically allocated.

Adaptive resource partitioning information (ARPI) allows the non-statically assigned subframes to be dynamically allocated. Any of protected, prohibited, or common subframes may be dynamically allocated (AU, AN, AC subframes, respectively). The dynamic assignments may change quickly, such as, for example, every one hundred milliseconds or less.

Heterogeneous networks may have eNBs of different power classes. For example, three power classes may be defined, in decreasing power class, as macro eNBs, pico eNBs, and femto eNBs. When macro eNBs, pico eNBs, and femto eNBs are in a co-channel deployment, the power spectral density (PSD) of the macro eNB (aggressor eNB) may be larger than the PSD of the pico eNB and the femto eNB (victim eNBs) creating large amounts of interference with the pico eNB and the femto eNB. Protected subframes may be used to reduce or minimize interference with the pico eNBs and femto eNBs. That is, a protected subframe may be scheduled for the victim eNB to correspond with a prohibited subframe on the aggressor eNB.

Figure 3:
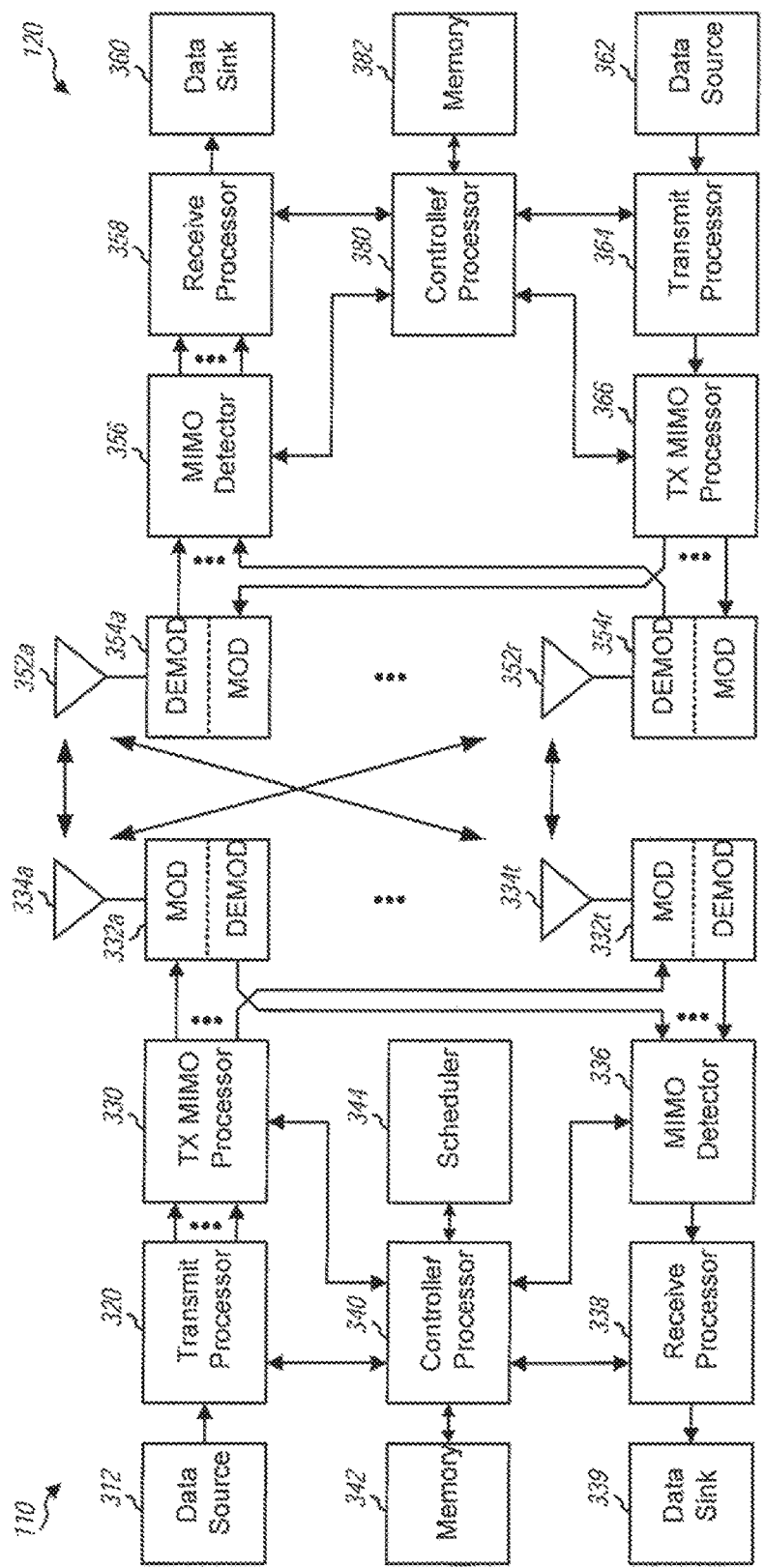
FIG. 3 is a block diagram conceptually illustrating a design of a base station/eNB and a UE configured according to one aspect of the present disclosure.

FIG. 3 shows a block diagram of a design of a base station/eNB 110 and a UE 120, which may be one of the base stations-eNBs and one of the UEs in FIG. 1, respectively. For a restricted association scenario, the eNB 110 may be the macro eNB 110c in FIG. 1, and the UE 120 may be the UE 120y. The eNB 110 may also be a base station of some other type. The eNB 110 may be equipped with antennas 334a through 334t, and the UE 120 may be equipped with antennas 352a through 352r.

At the eNB 110, a transmit processor 320 may receive data from a data source 312 and control information from a controller-processor 340. The control information may be for the PBCH, PCFICH, PHICH, PDCCH, etc. The data may be for the PDSCH, etc. The transmit processor 320 may process (e.g., encode and symbol map) the data and control information to obtain data symbols and control symbols, respectively. The transmit processor 320 may also generate reference symbols, e.g., for the PSS, SSS, and cell-specific reference signal. A transmit (TX) multiple-input multiple-output (MIMO) processor 330 may perform spatial processing (e.g., preceding) on the data symbols, the control symbols, and/or the reference symbols, if applicable, and may provide output symbol streams to the modulators (MODs) 332a through 332t. Each modulator 332 may process a respective output symbol stream (e.g., for OFDM, etc.) to obtain an output sample stream. Each modulator 332 may further process (e.g., convert to analog, amplify, filter, and upconvert) the output sample stream to obtain a downlink signal. Downlink signals from modulators 332a through 332t may be transmitted via the antennas 334a through 334t, respectively.

At the UE 120, the antennas 352a through 352r may receive the downlink signals from the eNB 110 and may provide received signals to the demodulators (DEMODs) 354a through 354r, respectively. Each demodulator 354 may condition (e.g., filter, amplify, downconvert, and digitize) a respective received signal to obtain input samples. Each demodulator 354 may further process the input samples (e.g., for OFDM, etc.) to obtain received symbols. A MIMO detector 356 may obtain received symbols from all the demodulators 354a through 354r, perform MIMO detection on the received symbols if applicable, and provide detected symbols. A receive processor 358 may process (e.g., demodulate, deinterleave, and decode) the detected symbols, provide decoded data for the UE 120 to a data sink 360, and provide decoded control information to a controller/processor 380.

On the uplink, at the UE 120, a transmit processor 364 may receive and process data (e.g., for the PUSCH) from a data source 362 and control information (e.g., for the PUCCH) from the controller/processor 380. The transmit processor 364 may also generate reference symbols for a reference signal. The symbols from the transmit processor 364 may be preceded by a TX MIMO processor 566 if applicable, further processed by the demodulators 354a through 354r (e.g., for SC-FDM, etc.), and transmitted to the eNB 110. At the eNB 110, the uplink signals from the UE 120 may be received by the antennas 334, processed by the modulators 332, detected by a MIMO detector 336 if applicable, and further processed by a receive processor 338 to obtain decoded data and control information sent by the UE 120. The processor 338 may provide the decoded data to it data sink 339 and the decoded control information to the controller/processor 340.

The controllers/processors 340 and 380 may direct the operation at the eNB 110 and the UE 120, respectively. The controller/processor 340 and/or other processors and modules at the eNB 110 may perform or direct the execution of various processes for the techniques described herein. The controllers/processor 380 and/or other processors and modules at the UE 120 may also perform or direct the execution of the functional blocks illustrated in FIG. 4, and/or other processes for the techniques described herein. The memories 342 and 382 may store data and program codes for the eNB 110 and the UE 120, respectively. A scheduler 344 may schedule UEs for data transmission on the downlink and/or uplink.

In streaming applications, such as voice/video call or video steaming, the header overhead of internet protocol (IP), user datagram protocol (UDP), and real-time transport protocol (RTP) comprises a large percentage of the total amount of data sent. For example, in case of speech data for IP telephony carried by RTP, a packet may, in addition to link layer framing, have an IP header (20 octets), a UDP header (8 octets), and an RTP header (12 octets) for a total of 40 octets. With IPv6, the IP header is 40 octets for a total of 60 octets. Robust Header Compression (ROHC) is, therefore, commonly used to compress the header overhead to improve the data transmission efficiency.

It should be understood that for ROHC compression, the terms "transmitter" and "compressor" are used interchangeably hereinafter, and the terms "receiver" and "decompressor" are used interchangeably hereinafter.

For ROHC compression, a transmitter/compressor, for example a UE or eNB, such as UE 110 and eNB 120 in FIG. 1, in a transmission mode compresses the header, and sends the compressed header to the receiver/decompressor (e.g., another UE or eNB in a receiving mode), which decompresses the header with the help of a "context." The context of the compressor is the state used to compress a header, while the context of the decompressor is the state used to decompress a compressed header. Either of these or the two in combination may be referred to as the "context," when it is clear which is intended. A context has a static part ("static context") and a dynamic pan ("dynamic context"). The static part does not change during a packet streaming session and includes static data such as IP addresses, UDP ports, and/or RTP synchronization source identifier. The dynamic part may change from packet to packet and may include dynamic data such as possible reference values from previous packet streams, e.g., information about how an IP identifier field changes and the typical inter-packet increase in sequence numbers or timestamps. Thus, when the context of a decompressor is not consistent with the context of the compressor, the decompression process may fail to reproduce the original header. Since a transmitter and receiver pair may transmit and/or receive multiple packet streams, each packet stream is assigned a context identifier (CID). A CID is either implicit and equal to zero or explicit and transmitted in each header if higher than zero.

A transmitter/compressor can be in one of three possible states: initialization and refresh (IR) state, first order (FO) state, and second order (SO) state. The transmitter/compressor starts in die lowest compression state (the IR state) and gradually transitions to higher compression states. The IR state initializes the static part of a context at the decompressor or recovers the static part after failure. In this state, the compressor sends complete header information. This includes all static and non-static fields in an uncompressed form plus some additional information. The compressor stays in the IR state until it is fairly confident that the decompressor has received the static information correctly.

During the FO state, the transmitter/compressor efficiently communicates irregularities in the packet stream. When operating in this state, the compressor may send information about all dynamic fields, but the information sent is usually compressed, at least partially. A few static fields may sometimes be updated. Some or all packets sent in the FO state may carry context updating information. The compressor will generally enter the FO state from the IR state, or from the SO state, whenever the headers of the packet stream do not conform to their previous pattern.

During the SO state, the transmitter/compressor may experience the most optimal compression. The compressor would generally enter the SO state when the header to be compressed is predictable given the RTP sequence number (SN). Based on this predictability, the compressor would be sufficiently confident that the decompressor has acquired all parameters of the functions from SN to other fields.

A receiver/decompressor can also be in one of three possible states: No Context state, Static Context state, and Full Context state. The decompressor would generally start in the lowest compression state, "No Context" state, and gradually transition to the higher states. In the No Context state, the decompressor may not have successfully decompressed a packet yet. Once a packet has been correctly decompressed (for example, upon reception of an initialization packet with static and dynamic information), the decompressor may transition to the Static Context state and then to the Full Context state. On the other hand, a decompressor may generally transition back to a lower state upon repeated failures of decompression. However, when that happens, the decompressor may first transition back to the Static Context state. From the Static Context state, reception of any packet sent by a compressor in the FO state would generally be sufficient to enable transition back to Full Context state again. However, when decompression of multiple packets sent by a compressor in the FO state tails while the decompressor is in Static Context state, the decompressor will transition further to the No Context state.

For example, when a voice transmission session begins between an eNB and a UE, the pair may function as follows: the eNB, initially in the IR state, sends complete header information, which includes all static and non-static fields in uncompressed form plus some additional information to the UE. The UE, initially in a No Context state and upon reception of the IR, associates a CID with the particular voice transmission session. After the static information has been correctly communicated to the UE, the eNB may transition to the FO state, followed by the SO state, while the UE may first transition to the Static Context state followed by the Full Context state. Voice transmission from the UE to the eNB would operate in a similar manner.

The ROHC scheme has three modes of operation: unidirectional (U-mode), bidirectional optimistic (O-mode), and bidirectional reliable mode (R-mode). Compression operations with ROHC starts in the U-mode. When in the U-mode, packets are sent in one direction only: from compressor to decompressor. Transitions between compressor states typically occur in response to periodic timeouts, while irregularities in the header field may change the patterns in the compressed packet stream. The transition from U-mode to one of the bidirectional modes (O-mode or R-mode) is initiated by the decompressor in the form of a feedback signal that is protected with a cyclic redundancy check (CRC). Upon reception of this feedback with the correct CRC, the compressor may switch to the indicated bidirectional mode (typically O-mode). In the U-mode, there is limited possibility of feedback from the receiver/decompressor, which is only allowed to send positive acknowledgement (ACK). An ACK message acknowledges successful decompression of a packet, which means that the context is up-to-date with a high probability. ACK(U) is generally used to denote an ACK message in the U-mode.

The bidirectional O-mode is similar to the unidirectional U-mode. The difference is that the O-mode includes a feedback channel that may be used to send error recovery requests and, optionally, acknowledgment of significant context updates from the decompressor to the compressor. It should be noted that such acknowledgments would not, however, be used for pure sequence number updates. For example, when an IR packet passes the CRC check and/or is correctly decompressed, a decompressor may send an ACK message to the compressor. Similar to ACK(U) in the U-mode, ACK(O) is generally used to denote an ACK message in the O-mode. On the other hand, when an IR packet fails to pass the CRC chock and/or is not correctly decompressed, a decompressor may send a negative acknowledge message (NACK). A NACK message indicates that the dynamic context of the decompressor is out of sync and the message may be generated when several successive packets have failed to be decompressed correctly. NACK(O) is generally used to denote a NACK message in the O-mode.

O-mode does not use periodic refreshes. Instead, a receiver/decompressor may send a negative acknowledgment message for static context (STATIC-NACK) to the transmitter/compressor upon reception of a packet with a compressed header for which receiver/decompressor does not have any known context (e.g., the compressed header has no matching CID). A STATIC-NACK indicates that the static context of the receiver/decompressor is invalid or has not been established. Hence, a receiver/decompressor expects a transmitter/compressor to immediately react to a STATIC-NACK by sending the IR in order to enable the receiver/decompressor to obtain the static context and latest dynamic context.

The R-mode differs in many ways from the U-mode and O-mode. Some important differences are a more intensive usage of the feedback channel and a more strict logic at both the compressor and the decompressor to prevent loss of context synchronization between compressor end decompressor. Feedback is sent to acknowledge all context updates, including updates of the sequence number field. However, not every packet updates the context in R-mode.

In a stream application, such as a voice/video call or video streaming over IP, ROHC decompression failure may occur after initial call set-up, handover to new cell, or call establishment/reestablishment. This usually happens when a receiver/decompressor loses the first a few packets with ROHC headers due to temporary impairment on the radio interface. The ROHC decompression failure may happen as follows: for example, in a voice transmission from an eNB to a UE (a symmetrical problem may happen in the UE to eNB direction), the eNB and the UE each may start in U-mode at the beginning the transmission. When the UE fails to receive the first few packets with an IR message due to radio interface impairment, it may not be able to establish static context of the voice stream, and hence has no known context to process the compressed headers. Since the UE is still in U-mode, it cannot notify the eNB about the failure, and may then rely on periodic transmission of IR message by the eNB. On the other side, eNB assumes the UE has been successfully received the IR message sent earlier, and transitions to the more efficient O-mode. eNB now sends ROHC packets that include compressed header, such as type 0, 1, 2 or IR-DYN packets. A type 0 packet has the most efficient compression pattern, while type 1, 2 and IR-DYN pockets are used when a bigger amount of information needs to be transmitted. A IR-DYN packet is a packet that includes comprehensive dynamic part of a context, but without static information of the context. The UE receives such packets with compressed header but is unable to decompress them as a CID has not been established and the static context is not stored. Thus the UE discards these voice packets from the eNB. If the voice packet transmission session has an interval of 20 milliseconds and the eNB periodically transmits an IR message in every 1024 voice frames, an interruption of more than 20 seconds can occur. In this case, an RTP inactivity timer (typically set to 20 s) is likely to expire on the UE side before any recovery can take place. The UE would then release the voice call using SIP (Session Initiation Protocol) signaling, and the call is dropped.

The following figures illustrate various embodiments of procedures for recovering ROHC when the IR message is either lost or could net be decoded. It should be understood that procedures described hereafter may not include all elements listed in the corresponding figures. Rather, the procedures may include any number of elements listed in the corresponding figures, and the elements may be in any order that is logical.

Figure 4:
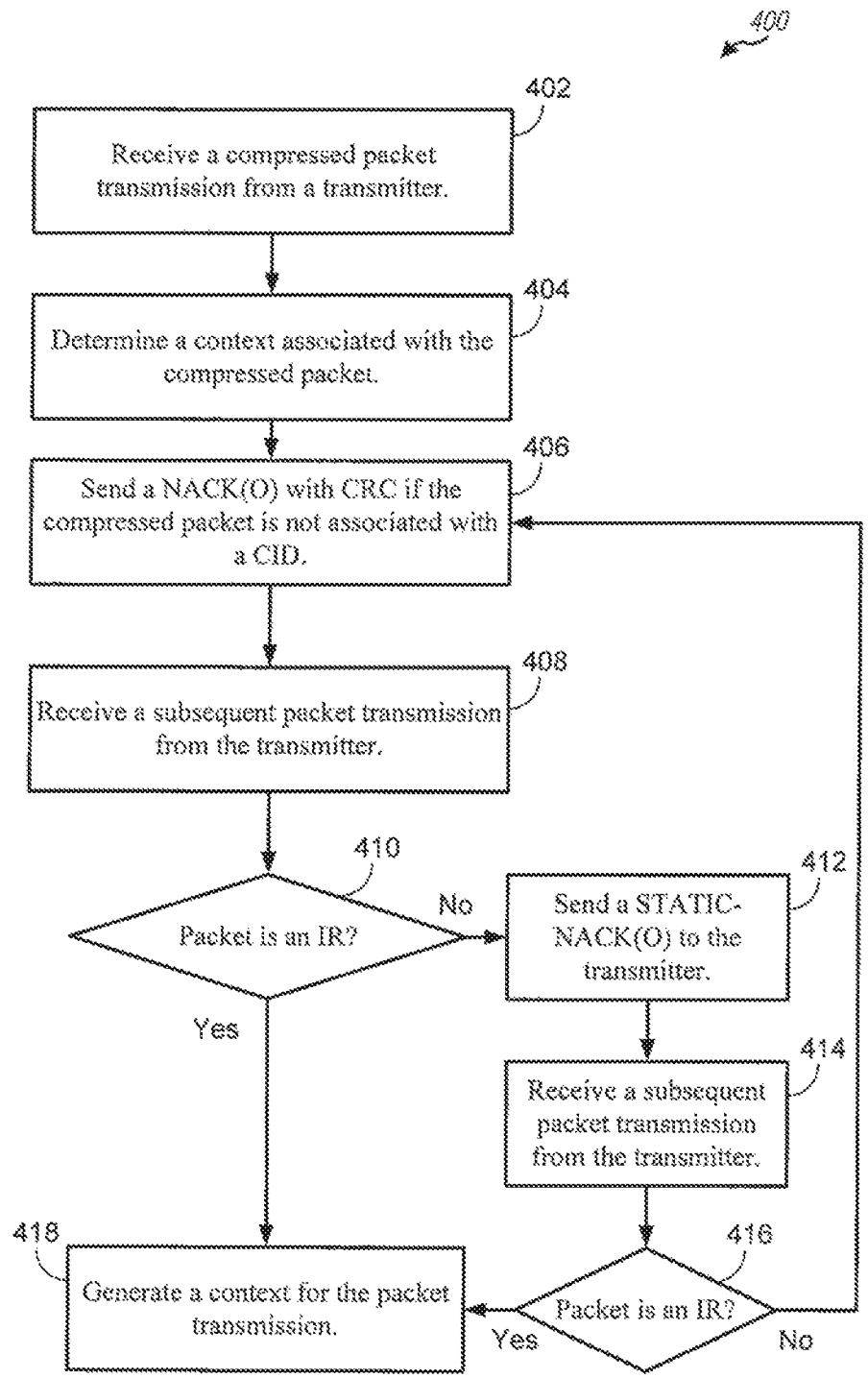
FIG. 4 is a block diagram illustrating example blocks executed to implement aspects of the present disclosure.

FIG. 4 it a block diagram illustrating example blocks of procedure 400 executed to implement one aspect of the present disclosure. In one aspect, procedure 400 comprises receiving 402, a compressed packet transmission at a receiver/decompressor from a transmitter/compressor, and determining 404 a context associated with the compressed packet transmission. The entity receiving the compressed packet transmission may include a UE, such as UE 120 (FIG. 3), including the components, hardware, firmware, and software used to define the features and functionality of UE 120. For example, under control of controller/processor 380, logic stored in memory 382 may create an operational environment in which the various blocks of procedure 400 may be executed. Controller/processor 380 would then control other hardware of components of UE 120, as depicted in FIG. 3, in order to implement procedure 400.

Procedure 400 may further comprise sending 406 a coded negative acknowledgement message, e.g., a NACK(O) with CRC, from the receiver to the transmitter if the compressed packet transmission is determined to be associated with an unknown context. For example, UE 120 would send such NACK(O) with CRC using transmit, processor 364, TX MIMO processor 366, demod/mod 354*a*-354*r*, and antennas 352*a*-352*r*, each under control of controller/processor 380. The compressed packet transmission may be a ROHC type 0, 1, 2 or IR-DYN pocket or other types of packet that does not include information for a receiver/decompressor to establish the context of the packet transmission. The packet may also be coded with CRC. In this case, the receiver will not be able to successfully decompress the compressed packet transmission received, since it does not have a context already associated with the packet and the packet itself does not provide the context either. Upon receiving a NACK(O) message with a valid CRC, the transmitter is generally required to transition to the O-mode. Once the transmitter is in the O-mode, it will be able to accept a subsequent STATIC-NACK(O) message sent from the receiver via the same transmitter chain of components described above with respect to UE 120.

In some embodiments, procedure 400 may further comprise receiving 408 a subsequent packet transmission from the transmitter. At block 410, the receiver may determine whether the received subsequent packet transmission is an IR, which contains information to establish a static context. If it is, the receiver may generate, at block 418, a context for the packet transmission session based on the received information. If the received packet is determined not to include an IR or other information that would allow establishing a static context, a static negative acknowledgement message, STATIC-NACK(O), may be sent from the receiver to the transmitter at block 412. The receiver may receive a subsequent packet transmission from the transmitter at block 414 and determine whether it is an IR or other type of packets that includes information to generate a context at block 416.

It should be noted that if the transmitter successfully received the NACK(O) sent in block 406 and switched to O-mode, it will be able to accept the STATIC-NACK(O) message sent in block 412 and, in response, resend an IR message to the receiver. In this case, the received subsequent packet in block 414 would be an IR, which the receiver can use to generate a context at block 418. If the received pocket is determined to be not an IR in block 416, blocks 406 and so forth will be repeated. In this way, alternating NACK(O) with CRC and STATIC-NACK(O) will be sent to the transmitter until the receiver receives an IR. This procedure assures that an IR message will be receive by the receiver even if any of the NACK(O), STATIC-NACK(O), or subsequent IR message is lost due to radio interface impairment.

Alternatively, when the received packet transmission is determined not to be an IR message in block 410, the receiver may determine whether the transmitter has switched to O-mode. This determination may be made based on the information included in the packet transmission from the transmitter received in block 408. If the transmitter is determined to be in O-mode, the receiver sends a STATIC-NACK(O) message in block 412, and block 414 and blocks thereafter ore followed. If the transmitter is determined not to be in O-mode after block 410, instead of sending a STATIC-NACK(O) message in block 412, block 406 and blocks thereafter are repeated until an a context is generated in block 518 based on received IR message.

It should be understood that procedures 400 and/or 500 described above can be carried out by either a UE, such as 110 described in FIG. 1 and corresponding text, in the receiving mode or an eNB, such as 110 described in FIG. 1 and corresponding text, in the receiving mode. Procedures 400 and/or 500 may be curried out with the assistance of one or more components of the UE or eNB described in FIG. 3. For example, the blocks in procedures 400 and/or 500 may be performed by a UE 110 using one or more components such as one or more antennae 334, MIMO detector 336, receive processor 338, data sink 339, controller processor 340, memory 342, and/or scheduler 344, as described in FIG. 3 and corresponding descriptions. Similarly, procedures 400 and/or 500 may be performed by the eNB 120 using one or more receiving components described in FIG. 3 and corresponding text.

It should be further understood that procedures 400 and/or 500 may be performed by a wireless communication system described in FIG. 1 and corresponding text. Procedures 400 and/or 500 may be executed by either an eNB while receiving packet transmissions from a UE or by an UE while receiving packet transmissions from an eNB, as described in FIG. 1.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or panicles, optical fields or particles, or any combination thereof.

The functional blocks and modules in FIG. 4 may comprise processors, electronics devices, hardware devices, electronics components, logical circuits, memories, software codes, firmware codes, etc, or any combination thereof.

Those of skill would further appreciate that the various illustrative logical blocks, modules, circuits, and algorithm steps described in correction with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the an. An exemplary storage medium is coupled to tire processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is property termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method of wireless communication, comprising:
   receiving a compressed packet transmission from a transmitter;
   determining a context associated with the compressed packet transmission;
   sending a coded negative acknowledgement message (NACK) that is protected with a cyclic redundancy check (CRC) from a receiver to the transmitter in response to determining the compressed packet transmission is associated with an unknown context;
   receiving a compressed packet transmission from the transmitter subsequent to the sending the NACK;
   sending a static negative acknowledgement message (STATIC NACK) to the transmitter in response to the compressed packet transmission subsequent to the sending the NACK failing to include information to generate the context in order to cause the transmitter to send the information to generate the context;
   receiving a compressed packet transmission from the transmitter subsequent to the sending the STATIC NACK; and
   alternating between sending the NACK and sending the STATIC NACK until a compressed packet transmission received subsequent to the sending the NACK or the sending the STATIC NACK includes the information from the transmitter to generate the context.

2. The method of claim 1, wherein the coded negative acknowledgement message comprises information indicating that the receiver lacks an accurate dynamic context associated with dynamic data transmission.

3. The method of claim 1, wherein the static negative acknowledgement message comprises information indicating that the receiver lacks the context associated with the compressed packet transmission.

4. The method of claim 1, wherein the coded negative acknowledge message comprises an error check mechanism.

5. An apparatus configured for wireless communication, the apparatus comprising:
   at least one processor; and
   a memory coupled to the at least one processor,
   wherein the at least one processor is configured:
   to receive a compressed packet transmission from a transmitter;
   to determine a context associated with the compressed packet transmission;
   to send a coded negative acknowledgement message (NACK) that is protected with a cyclic redundancy check (CRC) from a receiver to the transmitter in response to determining the compressed packet transmission is associated with an unknown context;
   to receive a compressed packet transmission from the transmitter subsequent to sending the NACK;
   to send a static negative acknowledgement message (STATIC NACK) to the transmitter in response to the compressed packet transmission subsequent to sending the NACK failing to include information to generate the context in order to cause the transmitter to send the information to generate the context;
   to receive a compressed packet transmission from the transmitter subsequent to sending the STATIC NACK; and
   to alternate between sending the NACK and sending the STATIC NACK until a compressed packet transmission received subsequent to the sending the NACK or the sending the STATIC NACK includes the information from the transmitter to generate the context.

6. The apparatus of claim 5, wherein the coded negative acknowledgement message comprises information indicating that the receiver lacks an accurate dynamic context associated with dynamic data transmission.

7. The apparatus of claim 5, wherein the static negative acknowledgement message comprises information indicating that the receiver lacks the context associated with the compressed packet transmission.

8. The apparatus of claim 5, wherein the coded negative acknowledge message comprises an error check mechanism.

9. A non-transitory computer-readable medium having program code recorded thereon, the program code comprising:
   program code for causing a computer to:
   receive a compressed packet transmission from a transmitter;
   determine a context associated with the compressed packet transmission;
   send a coded negative acknowledgement message (NACK) that is protected with a cyclic redundancy check (CRC) from a receiver to the transmitter in response to determining the compressed packet transmission is associated with an unknown context;
   receive a compressed packet transmission from the transmitter subsequent to sending the NACK;
   send a static negative acknowledgement message (STATIC NACK) to the transmitter in response to the compressed packet transmission subsequent to sending the NACK failing to include information to generate the context in order to cause the transmitter to send the information to generate the context;
   receive a compressed packet transmission from the transmitter subsequent to sending the STATIC NACK; and
   alternate between sending the NACK and sending the STATIC NACK until a compressed packet transmission received subsequent to the sending the NACK or the sending the STATIC NACK includes the information from the transmitter to generate the context.

10. The non-transitory computer-readable medium of claim 9, wherein the coded negative acknowledgement message comprises information indicating that the receiver lacks an accurate dynamic context associated with dynamic data transmission.

11. The non-transitory computer-readable medium of claim 9, wherein the static negative acknowledgement message comprises information indicating that the receiver lacks the context associated with the compressed packet transmission.

12. The non-transitory computer-readable medium of claim 9, wherein the coded negative acknowledge message comprises an error check mechanism.

13. An apparatus configured for wireless communication, the apparatus comprising:
   means for receiving a compressed packet transmission from a transmitter;

means for determining a context associated with the compressed packet transmission;

means for sending a coded negative acknowledgement message (NACK) that is protected with a cyclic redundancy check (CRC) from a receiver to the transmitter in response to determining the compressed packet transmission is associated with an unknown context;

means for receiving a compressed packet transmission from the transmitter subsequent to sending the NACK;

means for sending a static negative acknowledgement message (STATIC NACK) to the transmitter in response to the compressed packet transmission subsequent to sending the NACK failing to include information to generate the context in order to cause the transmitter to send the information to generate the context;

means for receiving a compressed packet transmission from the transmitter subsequent to sending the STATIC NACK; and means for alternating between sending the NACK and sending the STATIC NACK until a compressed packet transmission received subsequent to the sending the NACK or the sending the STATIC NACK includes the information from the transmitter to generate the context.

14. The apparatus of claim 13, wherein the coded negative acknowledgement message comprises information indicating that the receiver lacks an accurate dynamic context associated with dynamic data transmission.

15. The apparatus of claim 13, wherein the static negative acknowledgement message comprises information indicating that the receiver lacks the context associated with the compressed packet transmission.

16. The apparatus of claim 13, wherein the coded negative acknowledge message comprises an error check mechanism.

* * * * *